(12) United States Patent
Morton

(10) Patent No.: US 7,190,708 B2
(45) Date of Patent: Mar. 13, 2007

(54) ANNEALED COPPER ALLOY ELECTRODES FOR FLUORINE CONTAINING GAS DISCHARGE LASERS

(75) Inventor: Richard G. Morton, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 1026 days.

(21) Appl. No.: 09/742,485

(22) Filed: Dec. 20, 2000

(65) Prior Publication Data

US 2002/0122453 A1 Sep. 5, 2002

Related U.S. Application Data

(63) Continuation-in-part of application No. 09/703,697, filed on Nov. 1, 2000, now Pat. No. 6,363,094.

(51) Int. Cl.
- H01S 3/00 (2006.01)
- H01S 3/097 (2006.01)
- H01S 3/03 (2006.01)
- H01S 3/038 (2006.01)

(52) U.S. Cl. ............ 372/87; 372/55; 372/57; 372/58; 372/61

(58) Field of Classification Search ......... 372/55–65, 372/87
See application file for complete search history.

(56) References Cited

U.S. PATENT DOCUMENTS

| | | | |
|---|---|---|---|
| 4,077,017 A * | 2/1978 | Gilson | 331/94.5 PE |
| 4,414,488 A | 11/1983 | Hoffmann et al. | 315/39 |
| 4,546,482 A | 10/1985 | Bagaglia et al. | 372/86 |
| 4,686,682 A | 8/1987 | Haruta et al. | 372/87 |
| 4,703,490 A | 10/1987 | Brumme et al. | 372/86 |
| 4,742,527 A * | 5/1988 | Wiedemann et al. | 372/87 |
| 4,774,714 A | 9/1988 | Javan | 372/109 |
| 4,860,300 A * | 8/1989 | Baumler et al. | 372/57 |
| 4,876,693 A | 10/1989 | Lucero et al. | 372/82 |
| 4,959,840 A | 9/1990 | Akins et al. | 372/57 |
| 5,070,513 A | 12/1991 | Letardi | 372/83 |
| 5,220,575 A * | 6/1993 | Bosch et al. | 372/87 |
| 5,373,523 A * | 12/1994 | Fujimoto et al. | 372/59 |
| 5,535,233 A | 7/1996 | Mizoguchi et al. | 372/87 |
| 5,557,629 A | 9/1996 | Mizoguchi et al. | 372/87 |
| 5,729,565 A * | 3/1998 | Meller et al. | 372/87 |
| 5,771,258 A | 6/1998 | Morton et al. | 372/57 |
| 5,923,693 A * | 7/1999 | Ohmi et al. | 372/57 |
| 6,110,531 A * | 8/2000 | Paz de Araujo et al. | 427/255.25 |
| 6,222,868 B1 * | 4/2001 | Ouchi et al. | 372/50 |

FOREIGN PATENT DOCUMENTS

JP 2631607 7/1997 ............ 3/38

* cited by examiner

*Primary Examiner*—Stephone B. Allen
*Assistant Examiner*—Davienne Monbleau
(74) *Attorney, Agent, or Firm*—William C. Cray

(57) ABSTRACT

An excimer laser with a laser chamber containing a circulating laser gas containing fluorine and long-life, annealed, copper alloy electrodes. Electrode lifetime is increased by annealing them after the electrodes are machined. This annealing relieves the surface stress caused by the machining operation and reduces the exposed metallic grain boundary length per unit area on the surface of the electrodes, which provides substantial reduction in erosion caused by fluorine chemical attack. Annealing after machining also reduces the stress throughout the bulk of the electrode material. In preferred embodiments the anode is a copper-aluminum alloy and the cathode is a copper-zinc alloy.

13 Claims, 4 Drawing Sheets

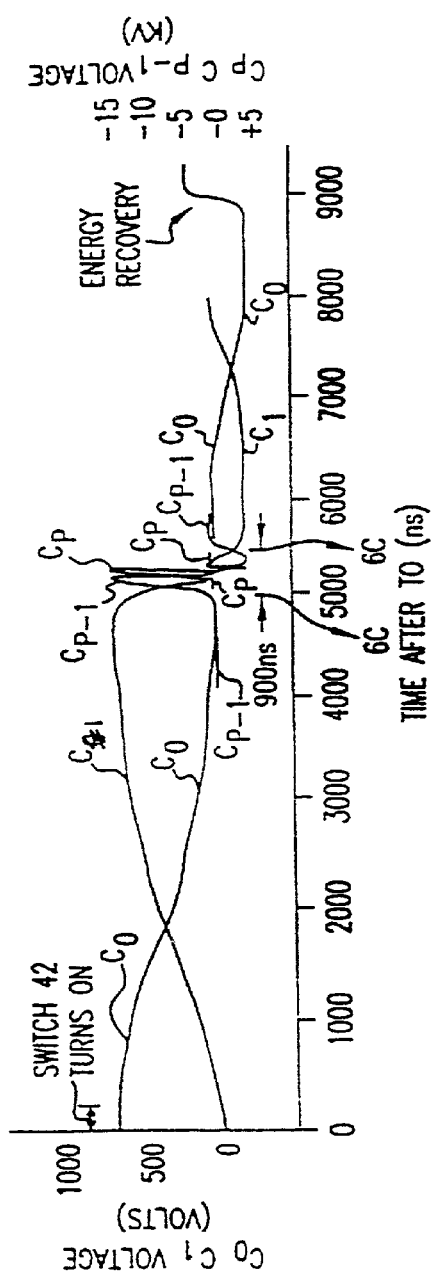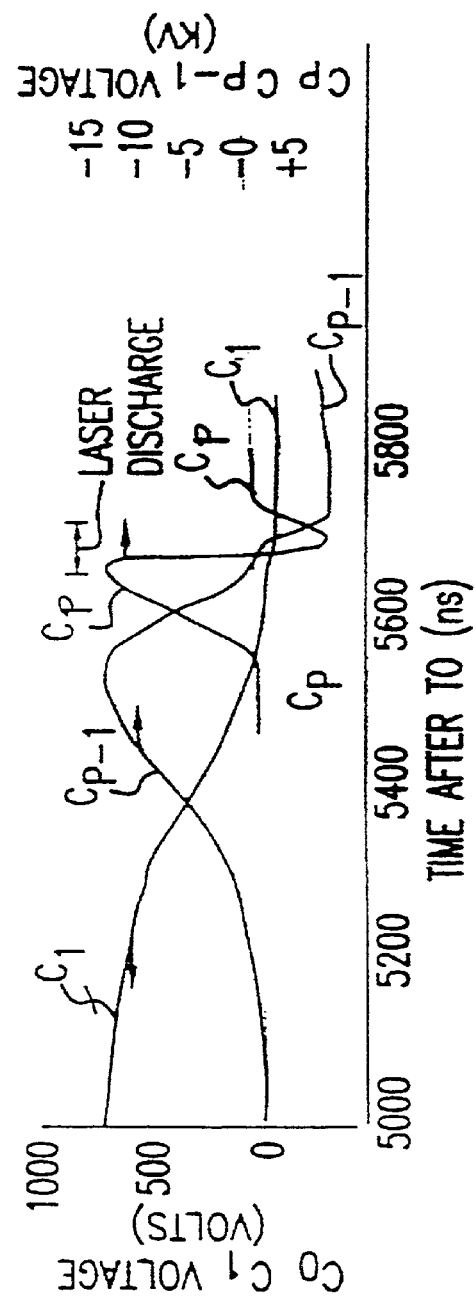

ANNEALED COPPER ALLOY ELECTRODES FOR FLUORINE CONTAINING GAS DISCHARGE LASERS

This application is a continuation-in-part of Ser. No. 09/703,697, filed Nov. 1, 2000 now U.S. Pat. No. 6,363,094 This invention relates to electric discharge lasers and in particular to electrodes for such lasers containing fluorine gas.

BACKGROUND OF THE INVENTION

The principal components of a prior art KrF excimer laser chambers are shown in FIG. 1. This chamber is a part of a laser system used as a light source for integrated circuit lithography. These components include a chamber housing 2. The housing contains two electrodes cathode 84 and anode 83 each about 55 cm long and spaced apart by about 20 mm, a blower 4 for circulating a laser gas between the electrodes at velocities fast enough to clear (from a discharge region between the two electrodes) debris from one pulse prior to the next succeeding pulse at a pulse repetition rate in the range of 1000 Hz or greater. (Gas velocities of about 10 m/s for each 1000 Hz pulse rate is typical.) The chamber includes a water cooled finned heat exchanger 6 for removing heat added to the laser gas by the fan and by electric discharges between the electrodes. Blower 4 is typically a squirrel cage type tangential fan providing high gas flow but at relatively low differential pressure. The chamber may also include baffles 60 and 64 and vanes 66 and 68 for improving reducing discharge caused acoustic effects and the aerodynamic geometry of the chamber. The laser gas is comprised of a mixture of about 0.1 percent fluorine, about 1.0 percent krypton and the rest neon. Each pulse is produced by applying a very high voltage potential across the electrodes with a pulse power supply which causes a discharge between the electrodes lasting about 30 nanoseconds to produce a gain region about 20 mm high, 3 mm wide and 525 mm long. (Two capacitors of a peaking capacitor bank are shown at 62.) The discharge deposits about 2.5 J of energy into the gain region. As shown in FIG. 2, lasing is produced in a resonant cavity, defined by an output coupler 20 and a grating based line narrowing unit (called a line narrowing package or LNP, shown disproportionately large) 22 comprising a three prism beam expander, a tuning mirror and a grating disposed in a Littrow configuration. The energy of the output pulse 3 in this prior art KrF lithography laser is typically about 10 mJ.

FIG. 3 shows an enlarged view of cathode 84 and anode 83. Each is about 3 cm wide but the discharge region 85 is only about 3 to 4 mm wide. The direction of gas flow is shown at 86 and a gas flow of 20 m/s is indicated. The cathode and anode are typically brass. The cathode is typically slidingly mounted on an insulator 84a and the anode is typically mounted on a metal support 83A.

These KrF lithography lasers typically operate in bursts of pulses at pulse rates of about 1000 to 2000 Hz. Each burst consists of a number of pulses, for example, about 80 pulses, one burst illuminating a single die section on a wafer with the bursts separated by down times of a fraction of a second while the lithography machine shifts the illumination between die sections. There is another down time of a few seconds when a new wafer is loaded. Therefore, in production, for example, a 2000 Hz, KrF excimer laser may operate at a duty factor of about 30 percent. The operation is 24 hours per day, seven days per week, 52 weeks per year. A laser operating at 2000 Hz "around the clock" at a 30 percent duty factor will accumulate more than 1.5 billion pulses per month. Any disruption of production can be extremely expensive. For these reasons, prior art excimer lasers designed for the lithography industry are modular so that maintenance down time is minimized.

Maintaining high quality of the laser beam produced by these lasers is very important because the lithography systems in which these laser light sources are used are currently required to produce integrated circuits with features smaller than 0.25 microns and feature sizes get smaller each year. Laser beam specifications limit the variation in individual pulse energy, the variation of the integrated energy of series of pulses, the variation of the laser wavelength and the magnitude of the bandwidth of the laser beam.

Typical operation of electric discharge laser chambers such as that depicted in FIG. 1 causes electrode erosion. Erosion of these electrodes affects the shape of the discharge which in turn affects the quality of the output beam as well as the laser efficiency. Typically, anode erosion in these excimer lasers is two to three times as severe as cathode erosion.

Electrode erosion is the result of a complex combination of physical phenomena including fluorine chemical attack and ion induced sputter. Use of alloys of copper for electrodes for gas discharge lasers is well known. For example, a common electrode material is a brass known as C36000 which is comprised of 61.5% copper, 35.5% zinc and 3% lead. It is known to anneal brass parts before they have been machined to make the parts less brittle.

What is needed is a gas discharge laser having electrodes with reduced erosion rates.

SUMMARY OF THE INVENTION

The present invention provides an excimer laser with a laser chamber containing a circulating laser gas containing fluorine and long-life, annealed, copper alloy electrodes. Electrode lifetime is increased by annealing them after the electrodes are machined. This annealing relieves the surface stress caused by the machining operation and reduces the exposed metallic grain boundary length per unit area on the surface of the electrodes, which provides substantial reduction in erosion caused by fluorine chemical attack. Annealing after machining also reduces the stress throughout the bulk of the electrode material. In preferred embodiments the anode is a copper-aluminum alloy and the cathode is a copper-zinc alloy.

BRIEF DESCRIPTION OF THE DRAWINGS

FIGS. 4A, and B show pulse shapes.

DETAILED DESCRIPTION OF PREFERRED EMBODIMENTS

Pulse Power Supply System

Figure 3:
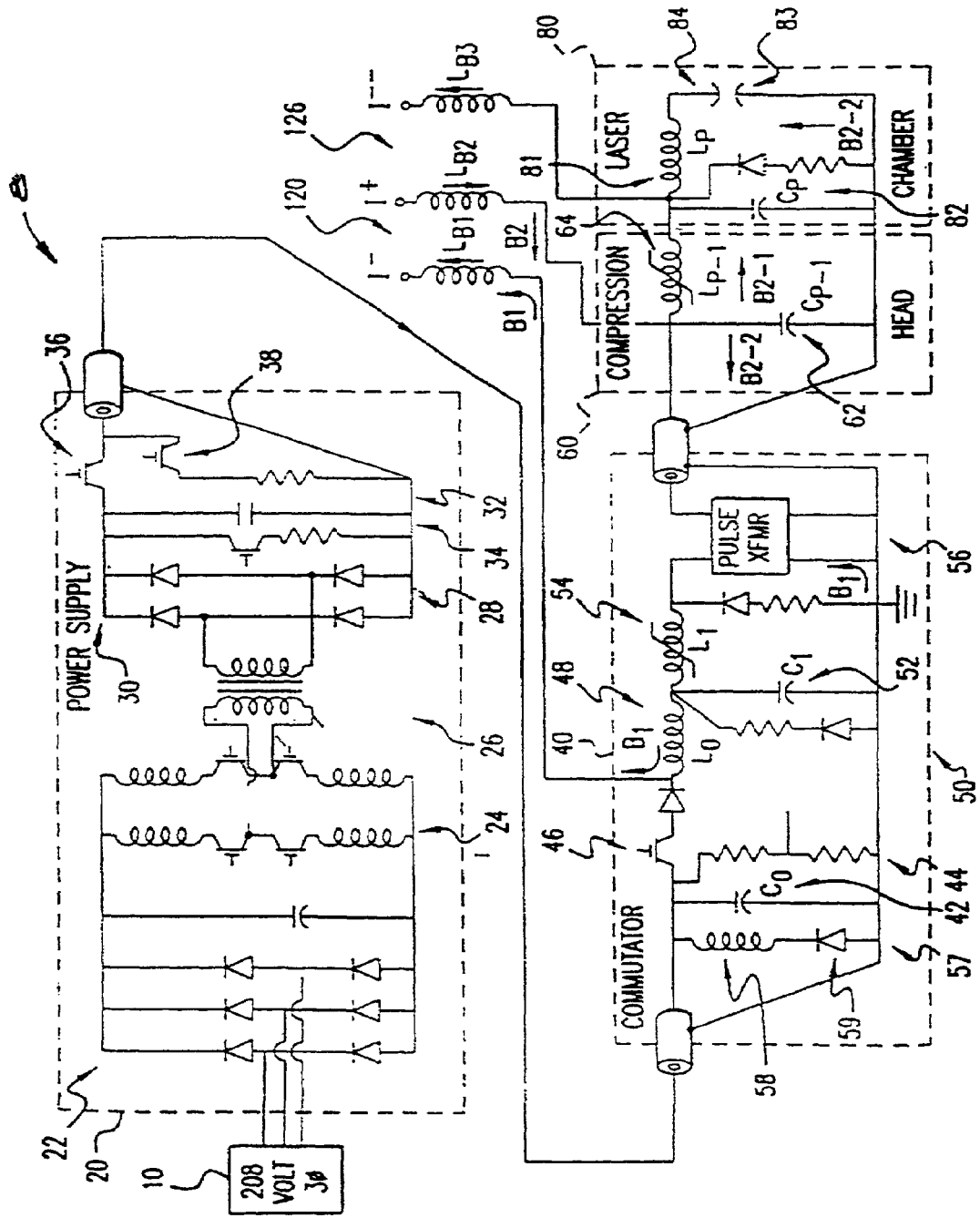
FIG. 3 shows an electrical drawing of a prior art pulse power system.

The principal components of an electrical circuit 8 for providing pulse power to produce electrical discharges in a gas discharge laser are shown in FIG. 3. The pulse power system operates from a standard 208-volt, 3 phase electrical source. A power supply using rectifier 22, inverter 24, transformer 26 and rectifier 30 charges 8.1 micro-Farad charging capacitor $C_0$ 42 to a voltage level between about 500 to 1200 volts as directed by a laser control processor (not shown). The laser control processor directs the closing of an IGBT switch 46 when a pulse is desired which causes the energy on $C_0$ to be discharged into the follow-on portions of the pulse power system. The charge on $C_0$ is transferred successively to capacitor bank $C_1$ 52 through inductor 48 then through saturable inductor 54 and through voltage transformer 56 to capacitor bank $C_{p-1}$ 62 and then through saturable inductor 64 to peaking capacitor bank $C_p$ 82. As shown in FIG. 3, peaking capacitor bank $C_p$ is connected electrically in parallel with electrodes 84 and 83.

FIG. 4A shows the potential on capacitor banks $C_0$, $C_1$, $C_{p-1}$ and $C_p$ as a function of time beginning with the closing of switch 42 and for the following 9 microseconds. FIG. 4B shows an 800 ns time slice just before and after the discharge. The reader should note that the peaking capacitor bank $C_p$ is charged to approximately $-15,000$ V just prior to the discharge. The discharge lasts about 30 ns. During the discharge, the electron flow is first from the upper electrode, cathode 84 to the lower grounded electrode, anode 83. A current "overshoot" charges $C_p$ to a positive value of about $+6,000$ V at which time the downward flow of electrons is reversed after which the electron flow is from the lower grounded electrode to the upper electrode during the last approximately 15 ns of the discharge, all as shown in FIG. 4B.

Erosion

Applicants have discovered that electrode erosion occurs on both electrodes but that the erosion rate of the grounded electrode (anode 83) is about four times that of the high voltage electrode (cathode 84). Also, operation normally results in an insulating layer of metal fluorides being built up very gradually on portions of the anode. In some cases near the end of life of the electrodes, the portion of the discharge surface covered by the layer can be between 50% to 80% or more. In the regions covered by the fluoride layer discharge current flows through tiny holes which typically tend to have approximately circular cross sections with diameters of about 50 to 100 microns. The surfaces covered by the fluoride layer do not suffer substantial further erosion but the erosion rate is increased on the non-covered discharge surfaces as the non-covered surface area decreases. (There appears to be some erosion on the covered surfaces at the locations of the tiny holes.) Electrode erosion and fluoride build up in prior art lasers typically becomes so severe that at about 5 to 10 billion pulses, the laser beam no longer meets quality specifications. At this time typically the laser chamber is replaced with a chamber with new electrodes. A replacement chamber costs several thousand dollars and replacement requires a temporary shutdown of integrated circuit production.

Most electric discharge lasers used for integrated circuit lithography utilize brass as the electrode material. Many other materials have been tested in efforts to discover better electrode material, but to the best of Applicant's knowledge none have been proven to be better than brass taking into consideration all costs including cost of laser manufacture and cost of operation. However, recent tests by Applicants' indicate that a high strength copper material containing submicron clumps of $Al_2O_3$ sold under the trademark GLID-COP® and available from OMG Americas with offices in Research Triangle Park, N.C. Many otherwise excellent electrode materials are not compatible with the extremely reactive fluorine gas in these chambers.

Sputtered Metal Ions—Important Part of Discharge

Figure 1A:
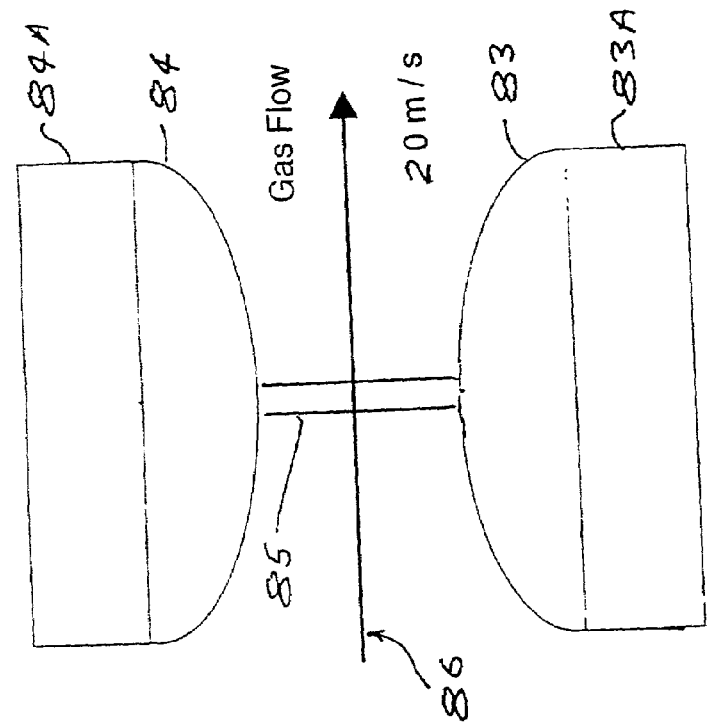
FIG. 1A is an enlarged view of the electrodes.
Figure 1:
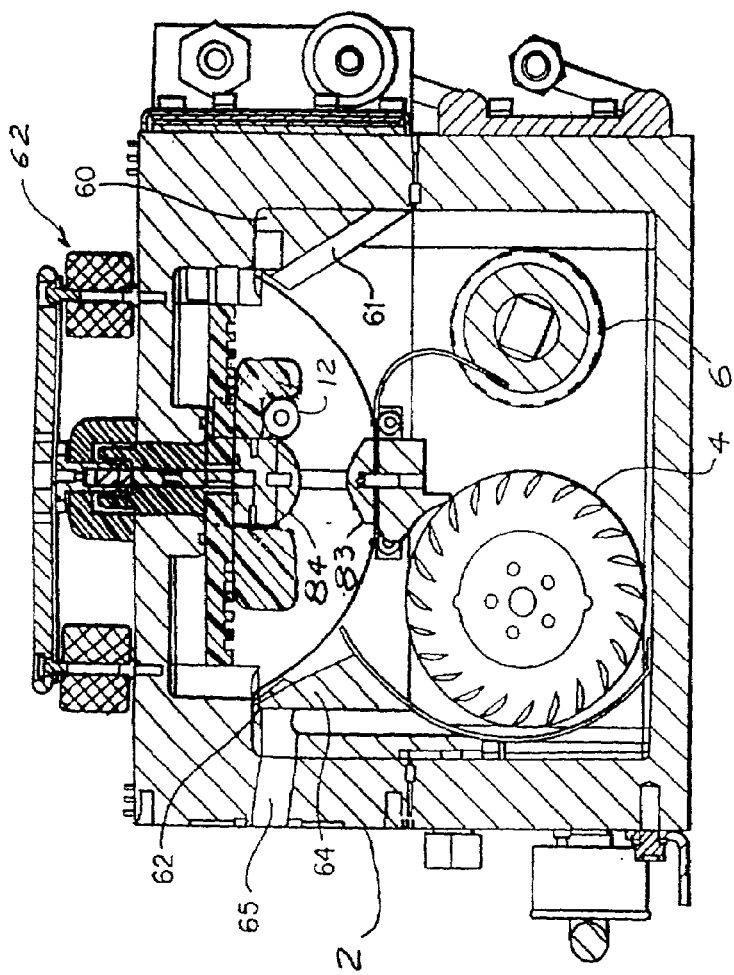
FIG. 1 shows a cross section of a prior art excimer laser chamber.

In order to create a good laser active media, a uniform discharge plasma must be created between the electrodes. Initially the gas in the gap between the electrodes is preionized with preionizer 12 shown in FIG. 1. As the voltage builds up on the electrodes a substantial portion of the plasma, in the regions close to the cathode is produced by ion sputtering of the electrode material. Metal atoms sputtered from the electrodes are mostly in vapor form and a substantial portion of the metal atoms are ionized and help form a positive ion cathode "fall" region immediately adjacent to the surface of the cathode creating an extremely large electric field which may contribute to the flow of electrons from the cathode and also accelerates electrons leaving the cathode. This process applies first to cathode 84 during the first portion of each pulse. However, because the polarity of the electrodes switch about halfway though the pulse, as shown in FIG. 4B, this effect also occurs to a much less extent at anode 83 which at that time functions as a cathode (i.e., the negative electrode). Both during and after the pulse the metal ions may be attracted back to the electrodes depending on the rapidly changing electric field conditions, but many combine with fluorine and/or are blown away by the circulating laser gas.

Issues

There are five important issues to deal with in developing a better electrode for electric discharge lithography lasers using fluorine containing laser gas:
1) electrode erosion seriously affects beam quality,
2) electrode erosion currently limits laser chamber life,
3) anode erosion is about four times cathode erosion,
4) fluoride layer buildup on the anode is a problem, and
5) maintaining good gas flow conditions in the discharge gap is very important.

The various embodiments of the present invention described herein deal with these issues. The electrodes satisfy the following criteria:
1) the electrodes comprise an erosion surface which erodes slowly over several billion laser pulses with the erosion not substantially affecting beam quality,
2) the erosion surfaces resists fluoride insulation buildup on discharge regions, and
3) the electrodes are designed to provide improved gas flow to permit repetition rates of 1,000 Hz to 6,000 Hz or greater without substantial turbulence in the discharge region.

FIRST PREFERRED EMBODIMENT

Figure 5B:
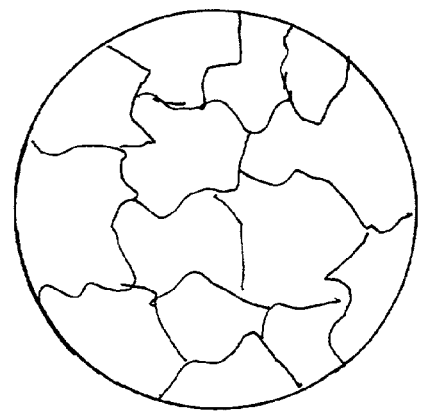
FIGS. 5A and 5B are microscopic sketches before and after annealing.
Figure 5A:
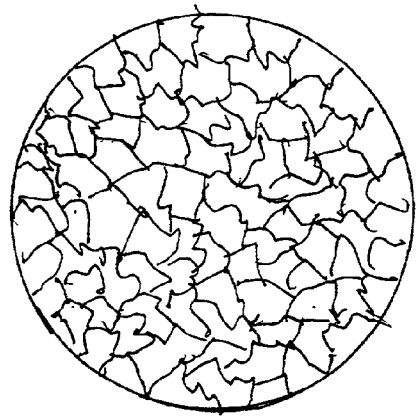
Figure 2:
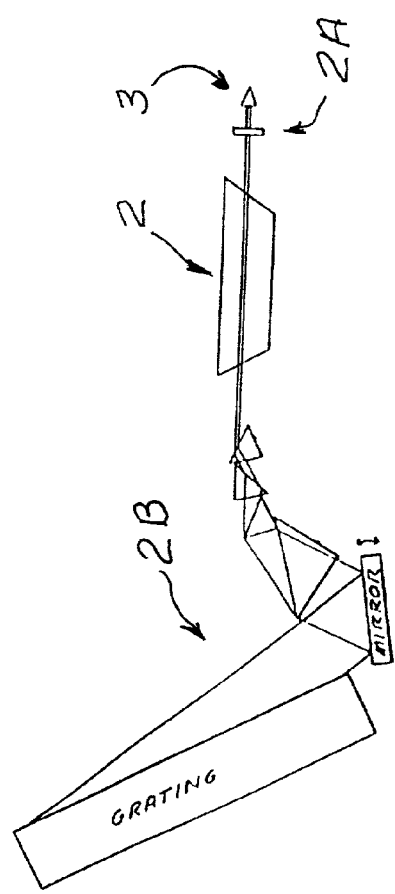
FIG. 2 is a block diagram of a narrow band laser system.

During tests with various copper alloys in an attempt to develop electrodes with improved lifetime in excimer laser environments, Applicant subjected electrode samples to electric discharges in an inert gas environment (with no fluorine present) prior to exposure of the samples to the fluorine containing excimer laser gas. Applicant discovered that this reduced electrode erosion rate for a substantial period of time after which the erosion rate returned to normal. In an attempt to explain this behavior, Applicant rediscovered a known fact, i.e., that the inert gas heating of the surface of the brass material very substantially reduced the grain boundaries in the surface of the electrodes. FIG. 5A is a sketch of a microscopic section of a small section of a newly machine electrode surface. FIG. 5B is a sketch similar size section after the surface has been heated in an inert atmosphere. As is indicated by the two sketches, the surface heating produced a very substantial increase in grain size in the surface material and a substantial reduction in grain boundary layers. Applicant realized then that fluorine chemical attack of the copper alloys is concentrated at grain boundaries and that the surface heat treating was the cause of the temporary reduced fluorine caused erosion. Applicant then had machined electrode samples annealed thoroughly to temperature in the range of about 830° C. These samples were then tested as anodes and cathodes. When configured as anodes, the annealed samples exhibited substantially increased lifetime but when configured as cathodes the annealed samples exhibited longer lifetime but the difference was not substantial.

Applicant explains this unexpected result as follows: electrode erosion of the anode occurs primarily as a result of fluorine attack. This attack occurs in the first few nanoseconds of each pulse in a burst of pulses after the first pulse. During this time interval, the electric field in the fall region of the anode is extremely large due to the voltage potential of about 20,000 volts applied initially across the electrodes. The result is that a large portion of fluorine ions created by the previous pulse which remain in the fall region of the anode will be attracted to the anode surface at substantial velocity with a substantial portion of these ions chemically combining with the electrode atoms to produce fluorides which in turn erode away or may in some cases build up to interfere with performance.

Since the cathode is initially charged to a negative 20,000 volts, any fluorine ions in the fall region of the cathode will be repelled away so that fluorine caused erosion of the cathode is minor. (Some small amount of fluorine erosion probably results due in part to the voltage reversal that occurs at the tail end of the pulse (see FIG. 4B.)

Cathode erosion is caused primarily by sputtering caused by positive ions of Kr or Ne (for the KrF laser) or Ar or Ne (for the ArF laser) created in the fall region of the cathode. Applicant's subsequent examination of cathode copper based electrodes comprised of substantial portion of zinc indicates that some of the cathode erosion is due to zinc diffusion up to the surface.

Comparison examinations indicate that annealing of the cathode electrodes after machining reduces this zinc diffusion. Again Applicant's explanation of this phenomenon is that the reduction in the total grain boundary length reduces the tendency of the zinc to migrate to the surface.

For both the cathode and the anode it is important that the electrode be annealed after machining. Therefore, when we use the phrase "after machining annealed" we mean annealed after machining.

Choice of Copper Alloys

Applicant has conducted a substantial number of tests and research in an effort to select the best copper based alloy for use in the excimer lasers discussed in the background section. Prior art brass electrodes such as C36000 brass (61.5% Cu, 35.5% En and 3% Pb) exhibit lifetimes of about 2 billion pulses in an ArF laser and about 4 billion pulses in a KrF laser.

Preferred Anode

Applicant has discovered that aluminum bronze such as C63200 (82% Cu, 10% Al, 5% Ni and 3% Fe) is more resistant to fluorine attacks than prior art zinc brass such as C36000 brass (61.5% Cu, 35.5% Zn and 3% Pb). Therefore in one preferred embodiment of this invention Applicant recommends that the anode be fabricated using this C63200 aluminum-bronze and that the electrode be annealed after machining. Applicant recommended annealing process is as follows:

Heat anode at 830° C. in inert atmosphere (e.g. $N_2$ or a noble gas or in vacuum) for about 12 hours Allow to cool slowly in oven for approximately 8 hours.

This recommended temperature is several hundred degrees higher than typical recommended brass part annealing temperatures, which are normally in the range of about 425° C. to 600° C. This typical recommended annealing temperature range is not sufficient for use of the alloys as electrodes, and is intended for mechanical parts fabrication such as gears, and the like.

Preferred Cathode

Applicant has tested the C63200 brass as a potential cathode electrode for these excimer lasers; however, Applicant's test indicate that the lifetime improvement indicated for the anode are not the same for the cathode and other copper based alloys are preferred for the cathode. Applicant expects that the aluminum in the cathode causes it to be more susceptible to sputter erosion and since sputter is the main cause of erosion of the cathode, heavier atoms are preferred for the cathode. Therefore, Applicant's preferred material for the cathode is C26000 brass (70% Cu, 29.93% Zn and 0.07% Pb). Another preferred material is C36000 brass which has been used by Applicant's employer for electrodes in its lasers for several years. These prior art electrodes were not annealed. Applicant's tests show that annealing the cathode after machining using the same procedure described above for the anode increases cathode lifetime. Applicant suspects that the increased cathode lifetime is a combined result of reduced zinc diffusion and some reduction in fluorine attack that occurs in the latter part of the discharge when the cathode functions as an anode.

Other Embodiment

Many embodiments of the present invention similar to the above-described embodiment are possible. The most important feature of the present invention is that the electrodes are comprised of a copper based alloy and that the electrodes are annealed after they are machined. Particular features of a preferred embodiment are that the anode should contain a significant percentage of aluminum, e.g., at least 7 percent. For the cathode, zinc is preferred to aluminum as the principal alloy material. At least 25% zinc is preferred. Preferred annealing temperature should be a temperature about 50° C. below the softening point of the copper alloy, i.e., much higher than normal annealing temperatures to assure maximum reduction in boundary layers and maximum metallic grain size.

While the invention has been described above with specificity in terms of preferred embodiments, the reader should understand and recognize that many changes and alterations could be made without deviating from the spirit of the invention. For example, the principals of this invention could be applied to many other gas discharge lasers other than KrF lasers such as, for example, ArF lasers, $F_2$ laser. Therefore, the scope of the invention should be determined by the appended claims and their legal equivalents.

I claim:

1. An excimer laser with long life electrodes, said laser comprising:
   A) a laser chamber containing a laser gas comprising fluorine;
   B) an electrode set comprising an elongated machined and annealed copper alloy cathode and an elongated machined and annealed copper alloy anode, wherein said cathode and anode are annealed after they are machined to reduce surface stress and to reduce exposed metallic grain boundary length on surfaces of said cathode and anode;

C) a circulating means for circulating said laser gas between said elongated electrodes; and D) a pulse power electrical system for generating electrical pulses between said electrodes to produce a laser gain medium.

2. A laser as in claim 1 wherein said elongated anode is comprised of at least 70% copper and 7% aluminum.

3. A laser as in claim 2 wherein said elongated anode also is comprised of nickel and iron.

4. A laser as in claim 3 wherein said elongated anode is comprised of approximately 82% Cu, 10% Al, 5% Ni and 3% Fe.

5. A laser as in claim 3 wherein said elongated cathode is comprised of at least 50% copper and at least 25% zinc.

6. A laser as in claim 4 wherein said elongated cathode is comprised of at least about 70% copper and at least 25% zinc.

7. A laser as in claim 4 wherein said elongated cathode is comprised of approximately 70% copper, 29.93% zinc and 0.07% lead.

8. A laser as in claim 1 wherein said elongated cathode is comprised of at least 50% copper and at least 25% zinc.

9. A laser as in claim 8 wherein said elongated cathode is also comprised of lead.

10. A laser as in claim 9 wherein said elongated cathode is comprised of approximately 61.5% copper, 35.5% zinc and 3% lead.

11. A laser as in claim 9 wherein said elongated cathode is comprised of approximately 70% copper, 29.93% zinc and 0.07% lead.

12. The apparatus of claim 1 further comprising:

said anode and said cathode each being the product of a process comprising annealing said anode and said cathode at substantially above 600° C.

13. The apparatus of claim 12 further comprising;

said anode arid said cathode each being the product of a process comprising annealing said anode and said cathode at least 500° C. below the softening point for the alloy respectively comprising the anode and the cathode.

* * * * *